United States Patent [19]

Blackmer

[11] 4,404,427
[45] Sep. 13, 1983

[54] AUDIO SIGNAL PROCESSING SYSTEM

[75] Inventor: David E. Blackmer, Wilton, N.H.

[73] Assignee: Kintek, Inc., Newton, Mass.

[21] Appl. No.: 98,972

[22] Filed: Nov. 30, 1979

[51] Int. Cl.$^3$ .......................... H04B 3/04; G10H 1/02
[52] U.S. Cl. ................................... 179/1 VL; 179/1 J
[58] Field of Search ..................... 179/1 F, 1 VL, 1 J, 179/1 GP, 1 G; 307/237, 264; 330/136, 279, 281, 99, 103, 110; 334/14

[56] References Cited

U.S. PATENT DOCUMENTS

| | | | |
|---|---|---|---|
| 3,681,618 | 8/1972 | Blackmer | 307/229 |
| 3,822,408 | 7/1974 | Veranth | 307/237 X |
| 3,918,003 | 11/1975 | Seidel | 330/279 |
| 3,968,384 | 7/1976 | Tracey et al. | 307/237 |
| 3,980,964 | 9/1976 | Grodinsky | 330/136 X |
| 4,039,755 | 8/1977 | Berkovitz | 179/1 G |
| 4,112,254 | 9/1978 | Blackmer | 179/1 VL |
| 4,166,924 | 9/1979 | Berkley et al. | 307/237 X |
| 4,184,047 | 1/1980 | Langford | 179/1 J |
| 4,220,929 | 9/1980 | Talbot et al. | 330/136 |
| 4,254,303 | 3/1981 | Takizawa | 179/1 VL |

OTHER PUBLICATIONS

Time Delay for Ambience-Audio, Dec. 1976.

Primary Examiner—Aristotelis M. Psitos
Attorney, Agent, or Firm—Schiller & Pandiscio

[57] ABSTRACT

An improved audio signal processing system for use in an audio reproduction apparatus is described. The apparatus is of the type for generating ambient effects and includes at least two channels for respectively transmitting an audio signal to at least two speakers so that one of the speakers reproduces sound in response to the audio signal at a predetermined delay with respect to the other. The improved system comprises gain control means, electrically connected to receive the audio signal being transmitted to the one speaker, for controlling the signal gain of the system in accordance with the signal level derivative of the audio signal.

15 Claims, 1 Drawing Figure

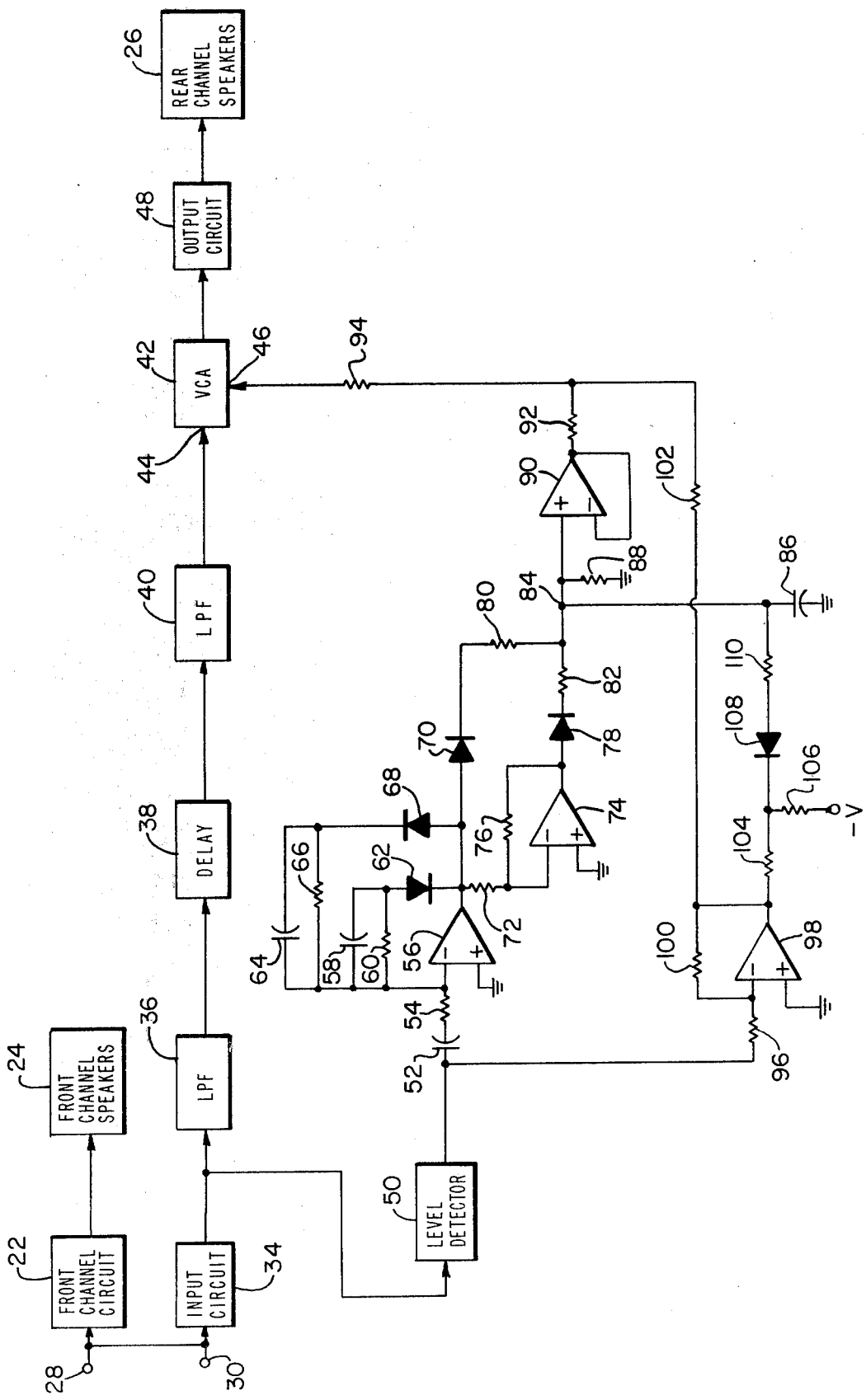

AUDIO SIGNAL PROCESSING SYSTEM

The present invention relates to audio reproduction systems and more particularly to systems for processing audio signals so as to create ambient effects.

Audio systems for creating ambient effects are well known. Such systems are now quite popular for use in sound reproduction areas such as movie theatres. Typically, the systems include plural channels for transmitting a like plurality of signals to speakers placed at select locations in the theatre. A popular approach to creating ambient effects is to delay the transmission of the audio signals to the speakers in the theatre. The amount of delay to each speaker is dependent upon the location of the speaker from the front of the theatre so that the speakers are sequentially driven from the front of the theatre to the rear of the theatre so as to create psychoacoustic effects of spatial awareness and depth.

One problem associated with some of these systems is that they do not discriminate among the various types of audio signals and impulse noise. The audio signals and impulse noise are therefore processed by the system in the same manner. One consequence of this indiscriminate processing is that localized sounds such as close miked dialogue are reproduced by speakers throughout the theatre, when it would be preferred to generate the sounds only from the front of the theatre. Further, impulse noise such as that associated with film splicing and the like, heard at the front of the theatre will be heard by a predetermined noticeable delay in the rear of the theatre producing a so-called "ping-pong" effect which is obviously undesirable.

One commercially available system utilizes a matrix comprising level shifters for comparing the levels in the various channels in order to mask undesirable noise. However, this system can only be used with films having soundtracks specially processed for use with the system.

It is a general object of the present invention to provide an improved audio signal processing system for generating ambient effects.

Another object of the present invention is to provide an improved audio reproduction system which distinguishes between impulse noise, audio signals which are preferably reproduced in a localized manner and those audio signals which are preferably reproduced with a greater sense of spatial depth and ambience.

And another object of the present invention is to provide an improved audio signal processing system of the type for generating ambient effects by signal delay and particularly adapted for use in theatres, the system being designed to reduce the undesirable effects created by impulse noise and to maintain the source of closed mike dialogue in the area of the screen.

Still another object of the present invention is to provide an improved motion picture sound reproduction system for creating ambient effects and reducing the undesirable effects of impulse noise and dialogue from the rear speakers of the system independent of the manner in which the sound is recorded on the soundtrack.

These and other objects of the present invention are achieved by an audio signal processing system for use in audio reproduction apparatus of the type including at least two channels for respectively transmitting an audio signal to at least two speakers so that one of the speakers reproduces sound in response to the audio signal at a predetermined delay with respect to the other. The system comprises gain control means, electrically connected to receive the audio signal being transmitted to the one speaker, for controlling the signal gain of the system in accordance with a function of the signal level derivative of the audio signal.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawing wherein:

The FIGURE is a schematic diagram, partially shown in block, of the preferred embodiment of the present invention.

Referring to the FIGURE, the system of the present invention is designed for use in audio reproduction apparatus, particularly those employed in movie theatres, of the type which include at least two channels for transmitting an audio signal to at least two speakers so that one of the speakers reproduces sound in response to the audio signal at a predetermined delay with respect to the other. For ease of exposition, the former channel and associated speaker will respectively be referred to as the rear channel and rear speaker (the latter being indicated at 26) while the latter channel and associated speaker will respectively be referred to as the front channel (indicated generally at 22) and front speaker (the latter being indicated at 24). It will be evident that each channel can drive more than one speaker and that more than two channels can be employed with the amount of delay varying from channel to channel. The amount of delay provided in each channel is such that the audio reproduction provided by the various speakers located at select locations in the area of reproduction (such as a movie theatre) will be at select time intervals so that the speakers are driven sequentially from the front of the area of reproduction to the rear creating a psychoacoustic effect of spatial awareness and depth. In the case of two channels for use in a movie theatre, the front speakers 24 would be positioned near the front of the theatre, adjacent the screen and speakers 26 towards the rear of the theatre.

In particular an audio signal, in the case of films derived from the soundtrack of the film, is applied to the input terminals 28 and 30 of the respective front and rear channels shown. The front channel circuit 22 transmits signals at the input terminal 28 to the front channel speaker 24. The input terminal 30 of the rear channel is connected to an input coupling circuit 34, the latter preferably including a coupling transformer. Circuit 34 is in turn connected to a first low pass filter 36. Filter 36 is a low pass filter having a cut-off frequency anywhere from 6 KHz to 12 KHz depending upon the desired frequency response of the system. The output of filter 36 is connected to delay 38. The latter may be any type of delay known in the art. For example, delay 38 may be a commercially available signal delay circuit referred to as a "bucket brigade". The amount of delay should be greater than the minimum necessary for a listener to detect the delay (i.e., the minimum being about 40 milliseconds) and a function of the distance between the front speakers 24 and the rear speakers 26. For a typical movie theatre the delay between the sound provided from the front speakers 24 at the front of the theatre and the sound provided from the rear speakers positioned at the rear of the theatre is preferably from 50-100 milliseconds to provide the desired psychoacoustical effect.

The output of delay 38 is connected to the low pass filter 40 which is similar to filter 36 and has a cut-off frequency from 6 KHz to 12 KHz depending on the desired frequency response of the system. The output of filter 40 is connected to the signal input terminal 44 of a signal multiplier circuit, in the form of voltage control amplifier 42. The latter preferably is of the type described in U.S. Pat. No. 3,714,462 issued to David E. Blackmer on Jan. 30, 1973, although other equivalent circuits are well known in the art. Generally, the amplifier 42 controls the gain of the signal provided at its signal input terminal 44 as a function of the control signal provided at its control signal input terminal 46. The gain sense of amplifier 42 preferably is set so that a positive control signal at the control signal input terminal 46 results in a decrease in signal gain. In the preferred embodiment of the present invention amplifier 42 provides a gain reduction of approximately 10 db to 20 db for closed-mike voice signals or sudden signal changes as compared to the gain selected as optimum for loud continuous signals. The output of the amplifier 42 is connected to an output coupling circuit 48, the output of which is utilized to drive the rear speakers 26. Coupling circuit 48 is provided to block D.C. signals to the speakers 26 as well as to prevent radio frequency interference and does not form part of the present invention.

The control signal applied to control terminal 46 is derived from a detection path of the system of the present invention. In particular, the output of coupling circuit 34 is detected by level detector 50. The latter may be any type of device for detecting the amplitude of the output of circuit 34. The detected amplitude depends upon the type of detector used and for example may be the average, peak or RMS amplitude. Preferably, detector 50 is of the type described and claimed in U.S. Pat. No. 3,681,618 issued to David E. Blackmer on Aug. 1, 1972 which provides an output signal logarithmically related to the RMS amplitude of the input signal to the detector, i.e. is linearly related in db to the RMS input. In the preferred embodiment the output of level detector 50 is positive going for increasing signals at its input and negative going for decreasing signals at its input. For example, the detector can provide an output of six millivolts per decibel, although it will be obvious to one skilled in the art that this can vary.

The output of detector 50 is connected to a derivative circuit formed by capacitor 52 having one plate connected to receive the output of the detector and its other plate connected to the resistor 54. The resistor 54 is in turn connected to the inverting input of operational amplifier 56, which has its positive input connected to ground. The inverting input and the output of amplifier 56 are connected together through two feedback paths, which as will be more apparent hereinafter, respectively define two proportionally constants, one for increasing signals at the inverting input of amplifier 56 and one for decreasing signals at the inverting input of the amplifier. As shown, the feedback path for positively increasing signals is provided by connecting the inverting input terminal of amplifier 56 to both capacitor 58 and resistor 60, both of which are in turn connected to the anode of diode 62. The cathode of the diode is connected to the output of the amplifier. The other feedback path for decreasing signals is provided by connecting the inverting input terminal of amplifier 56 to both capacitor 64 and resistor 66, both of which are connected in turn to the cathode of diode 68. The anode of diode 68 is connected to the output of the amplifier. The output signal of amplifier 56 is rectified by connecting the output of the amplifier to the anode of diode 70 and through resistor 72 to the inverting input terminal of the inverting amplifier 74 (the latter having its positive input terminal connected to system ground and its inverting input connected to its output terminal through feedback resistor 76) which in turn has its output connected to the anode of diode 78. The cathode of diodes 70 and 78 are connected through respective resistors 80 and 82 to the rectified output junction 84.

Junction 84 is connected to system ground through each capacitor 86 and resistor 88. The junction 84 is also connected to the buffer amplifier 90. The output of amplifier 90 is connected to its inverting input and to resistor 92, the latter in turn being connected to resistor 94. Resistor 94 is connected to control signal input terminal 46 of amplifier 42.

As will be more evident hereinafter, capacitor 86 functions as a charge storage device which charges with increasing signal levels of the rectified output of diodes 70 and 78 and discharges through resistor 88 with decreasing signal levels of the rectified output. The values of capacitor 86 and resistor 88 are such as to provide a relatively long capacitive rate of discharge and provide a relatively short term memory of the previous signal levels in order to prevent overreaction to fast changing audio signals. For example, in the preferred form of the invention the RC time constant is 22 seconds, although the value of the constant can vary.

Frequently, it may be desirable to speed up recovery of the detection path where the audio signal being transmitted through the rear channel is a long lasting sustained rising signal, such as encountered with sounds for which ambient effects are desirable. Accordingly, the system also preferably includes means for providing such a recovery when the signal is a relatively long lasting sustained rising signal. More particularly, as shown the output of detector 50 is also connected to resistor 96, which in turn is connected to the inverting input terminal of inverting amplifier 98 (amplifier 98 having its positive input terminal connected to system ground and its output terminal connected to its inverting input terminal through feedback resistor 100). The output terminal of amplifier 98 is connected through coupling resistor 102 to the junction formed by resistors 92 and 94. For reasons which will be apparent hereinafter resistor 102 functions to couple the voltage dependent signal level output of amplifier 98 to the control signal input terminal 46 in order to provide dynamic expansion of the signal transmitted through the rear channel when the signal is a relatively long lasting sustained rising signal i.e., the loud passages are made louder. In the preferred form of the invention, the expansion provided by amplifier 42 is set to provide a 1.3 expansion factor, although the expansion factor can vary. The output of the amplifier 98 is also connected to the resistor 104. The latter is in turn connected through resistor 106 to a negative DC voltage potential and directly to the cathode of diode 108. The anode of diode 108 is connected through resistor 110 to junction 84.

The operation of the system depends upon the nature of the signal applied to terminals 28 and 30. Generally, the shorter the duration of the signal the greater the gain reduction of the signal transmitted through the channel, i.e. the greater the gain reduction of the signal applied to the input terminal 44 of the voltage control amplifier 42. This result occurs because the output of detector 50 is applied to the derivative circuit formed by capacitor 52 and resistor 54 and subsequently rectified so as to provide relatively small control signals to the control signal input terminal 46 of amplifier 42 for slowly changing signals and relatively large signals to the control signal input terminal for quickly changing signals.

More particularly, when the audio signal is applied to the input terminals 28 and 30 the detector 50 will provide an output signal as a logarithmic function of the RMS value of the output of the input coupling circuit 34. The signal level derivative of the output of detector 50 is then generated by the output of capacitor 52 and resistor 54. When the signal detected is impulse noise, such as that associated with film splicing, or consists of rapidly rising and falling levels such as are characteristic of closed mike voices or stacatto music passages, the signal will resemble one or more spikes with a rapidly rising portion followed by a rapidly falling portion. By differentiating this spike. i.e., forming a waveform as a function of the slope of the spike, the slope of the rapidly rising portion is steep so as to provide a relatively large output which is applied to the inverting input of amplifier 56. Since the signal is positive, the feedback path formed by capacitor 58, resistor 60 and diode 62 will be conductive while the feedback path formed by capacitor 64, resistor 66 and diode 68 will not be conductive. The output is transmitted through diode 70 and resistor 80 to junction 84 where it charges capacitor 86. Since the slope of the rapidly changing signals applied to the derivative circuit of capacitor 52 and resistor 54, quickly changes from a positive slope to a negative slope, the signal applied to amplifier 56 quickly changes from a relatively large positive signal to a relatively large negative signal. The feedback path formed by capacitor 58, resistor 60 and diode 62 stops conducting and the feedback path formed by capacitor 64, resistor 66 and diode 68 becomes conductive. The resulting negative output of amplifier 74 is transmitted through diode 78 and resistor 80 to the junction 84 whereupon capacitor 86 is further charged. The increase in voltage across capacitor 86 due to the spike is transmitted through amplifier 90 to the control signal input terminal 46 of the voltage control amplifier 42 whereupon the spike which is transmitted through filter 36, delay 38, filter 40 and applied to the input terminal 44 of amplifier 42 will be masked from the output of the rear speakers 26 due to a reduction in signal gain provided by amplifier 42. The amount of signal gain reduction provided by the amplifier 42 to signals associated with close miked voices, stacatto music and the like is such that the front speakers would appear to provide substantially all of the sound providing the desired localized effect that the sound is coming from the front speakers near their source.

The two different proportionality factors respectively determined by capacitor 58, resistor 60 and capacitor 64, resistor 66 are provided to take into account the manner in which speech is formed and in particular the difference between the initial formation of a sound and the ending of the sound, the former usually occurring more quickly than the latter. In the preferred embodiment capacitor 58 and resistor 60 are provided with values of 10 nanofarads and 100 kilohms, respectively and capacitor 64 and resistor 66 are provided with values of 3.3 nanofarads and 1 megaohm, respectively, although these values may vary. It will be evident that capacitors 58 and 64 tend to smooth the signal output of the derivative circuit formed by capacitor 52 and resistor 54, particularly when the signal levels are derived from speaking voices.

Finally, with regard to very slow changing signals such as that encountered in some special effects and some music, the rate of change of the output of detector 50 is very slow so that the signal output of amplifier 56 is small and the capacitor 86 charges slowly. This results in a slow discharge of capacitor 86 through resistor 88 so that the control signal is relatively small and the signal gain provided by amplifier 42 is increased. By increasing the signal gain, the signal transmitted through the rear channel and appearing at the output of circuit 48 is large enough to drive the rear speakers 26 and provide the delayed sonic signal through the rear channel speakers relative to the sonic signal provided by the front channel speakers increasing the ambient effects of spatial awareness and depth.

In addition to the foregoing operation, when a suddenly increasing signal of substantially long duration is provided at the output of detector 50, the derivative circuit formed by capacitor 52 and resistor 54, amplifier 56 and conducted through diode 70 would initially provide a large increase in charge on capacitor 86 (due to the positive incursion of the signal). This would normally result in an increase in the control signal level at terminal 46 and a reduction of the signal transmitted through the channel. However, due to the long duration of the signal, it is desirable to allow the signal to drive the rear channel speakers. The foregoing is accomplished by virture of the fact that the output of detector 50 increases after the positive incursion of the signal level output of circuit 34 raising the input level of the inverting amplifier 98. The output of amplifier 98 thus goes negative (approximately −2 to −3 volts in the preferred embodiment). This causes the diode 108 to become forward biased due to the voltage on capacitor 86 being greater than the voltage at the output of amplifier 98. This results in a more rapid discharge of the capacitor 86 through diode 108 and a reduction in the control signal level at the control signal input terminal 46 of the amplifier 42 and hence a more rapid recovery in signal gain. Further, a sudden negative voltage level at the output of amplifier 98 produces a drop in the signal level at the control signal input terminal 46 of amplifier 42 resulting in signal expansion.

The system therefore has the advantage of controlling signal gain in a delay channel of an audio reproduction apparatus based upon the rate of change of the signal so that reproduction is not dependent upon how the audio signal is originally recorded. The system can be utilized with various types of recorded movie sound tracks such as monophonically recorded tracks. Further, for signals of relatively short duration such as voice, the signal gain of amplifier 42 will be such that the signal in the rear channel will be substantially reduced when compared to that of the front channel. This results in most of the sound being generated from the front speakers so as to provide a localization of sound, i.e. the psychoacoustical effect that the sound is coming from the source at the front of the area of reproduction.

However, where sounds of long duration, such as music, long lasting special effects, etc., are transmitted through the control signal level at the control signal input terminal 46 is low, there is very little signal reduction and the speakers will provide sonic signals so as to create the desired ambient effect.

It will be appreciated that various modifications can be made to the system of the present invention without departing from the principles of the invention. For example, although level detector 50 is connected to detect the level of the audio signal in the rear channel prior to the delay provided by delay 38, the detector 50 can also be connected to detect the level of the audio signal subsequent to the delay, eg, level detector 50 can be connected to receive the output of delay 38 or filter 40.

Since certain other changes may be made in the above system without departing from the scope of the invention herein involved it is intended that all matter contained in the above description or shown in the accompanying drawings shall be interpreted in an illustrative and not in a limiting sense.

What is claimed is:

1. An audio signal processing system of the type for generating ambient effects, said system comprising:
   at least two channels for respectively transmitting an audio signal to at least two speakers so that one of the speakers reproduces sound in response to the audio signal at a predetermined delay with respect to the other of said speakers;
   means responsive to the signal level of said audio signal for producing a gain control signal as a function of the derivative of the signal level of said audio signal; and
   gain control means electrically connected to receive the audio signal being transmitted to said one speaker for controlling the signal gain impressed on the audio signal being transmitted to said one speaker as a function of said gain control signal;
   wherein said gain control means provides (A) gain reduction on (1) impulse noise transmitted in the channel for transmitting said audio signal to said one speaker and (2) audio signals of a first kind transmitted in said channel for transmitting said audio signal to said one speaker and adapted to be reproduced by said other speaker in a localized manner, and (B) signal expansion on audio signals of a second kind transmitted in said channel for transmitting said audio signal to said one speaker and adapted to be reproduced by said at least two speakers with a spatial depth.

2. A system according to claim 1, wherein said gain control means reduces the signal gain of said impulse noise and audio signals of said first kind as a function of the magnitude of said control signal.

3. A system according to claim 1, wherein said means for producing said gain control signal includes detection means for detecting the amplitude of said audio signal and for generating a first signal as a function of said amplitude, and means for generating a second signal as a function of derivative of the signal level of said first signal.

4. A system according to claim 3, wherein the magnitude of said first signal is a logarithmic function of the RMS value of said audio signal.

5. A system according to claim 3, wherein said means for producing said control signal includes means for amplifying said second signal in accordance with a first proportionality factor when said first signal is a function of a positive derivative of the signal level of said audio signal, and means for amplifying said second signal in accordance with a second proportionality factor when said first signal is a function of a negative derivative of the signal level of said audio signal.

6. A system according to claim 5, wherein said means for producing said control signal further includes means for rectifying said second signal so as to provide a rectified third signal, and charge storage means for storing the signal level of said third signal, wherein said control signal is derived from the signal level in said charge storage means.

7. A system according to claim 6, wherein said means for generating said control signal further includes means for discharging the signal level of said third signal from said charge storage means at a predetermined rate of discharge.

8. A system according to claim 3, wherein said means for producing said control signal further includes charge storage means for storing the signal level of said second signal, wherein said control signal is derived from the signal level of said charge storage means, and means for discharging the signal level of said second signal from said charge storage means at a predetermined rate of discharge.

9. A system according to claim 8, wherein said means for producing said control signal further includes means for increasing the rate of discharge of the signal level of said second signal from said charge storage means as a function of the amplitude and duration of said audio signal.

10. A system according to claim 9, wherein said means for increasing the rate of discharge includes means for modifying said control signal so that said gain control means expands said audio signal when said rate of discharge is increased.

11. A system according to claim 10, wherein said means for increasing the rate of discharge of said charge storage means includes means for detecting said first signal and for discharging said charge storage means as a function of the amplitude of said first signal.

12. A system according to claim 3, wherein said system includes means electrically connected to said gain control means for delaying said audio signal and said detection means is electrically connected so as to detect said audio signal prior to the delay of said audio signal.

13. In an audio signal processing system comprising a channel for transmitting an audio signal to a speaker so that the speaker reproduces sound in response to the audio signal, the improvement comprising:
   gain control means electrically connected to receive the audio signal being transmitted to said speaker for controlling the signal gain impressed on said audio signal in response to a gain control signal; and
   signal generating means for generating said gain control signal, said signal generating means including
   (1) means for detecting the amplitude of said audio signal and for generating a first signal as a function of said amplitude;
   (2) means for generating a second signal as a function of the derivative of the signal level of said first signal;
   (3) first amplification means for amplifying said second signal as a function of a first proportionality factor when said first signal is a function of a positive derivative of the signal level of said audio signal;

(4) second amplification means for amplifying said second signal as a function of a second proportionality factor, different from said first proportionality factor, when said first signal is a function of a negative derivative of the signal level of said audio signal; and (5) means for producing said gain control signal from said second signal as amplified by the appropriate one of said first and second amplification means.

14. An audio signal processing system according to claim 13, further comprising at least two channels for respectively transmitting said audio signal to at least two speakers so that one of said speakers reproduces said sound in response to the audio signal at a predetermined delay with respect to the other, wherein said gain control means is electrically connected to receive the audio signal transmitted to said one speaker.

15. An audio signal processing system according to claim 13, wherein said first and second proportionality factors are chosen so that said gain control means impresses a different signal gain on said audio signal when the signal levels of said audio signal change relatively slowly and when said audio signal is representative of impulse noise, closed mike speech and staccato music.

* * * * *